United States Patent
Zhang et al.

(10) Patent No.: US 11,804,380 B2
(45) Date of Patent: Oct. 31, 2023

(54) HIGH-THROUGHPUT DRY ETCHING OF FILMS CONTAINING SILICON-OXYGEN COMPONENTS OR SILICON-NITROGEN COMPONENTS BY PROTON-MEDIATED CATALYST FORMATION

(71) Applicant: Tokyo Electron Limited, Tokyo (JP)

(72) Inventors: Du Zhang, Albany, NY (US); Yu-Hao Tsai, Albany, NY (US); Mingmei Wang, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/515,133

(22) Filed: Oct. 29, 2021

(65) Prior Publication Data
US 2022/0157615 A1    May 19, 2022

Related U.S. Application Data

(60) Provisional application No. 63/113,613, filed on Nov. 13, 2020.

(51) Int. Cl.
*H01L 21/311* (2006.01)
(52) U.S. Cl.
CPC ............ *H01L 21/31116* (2013.01)

(58) Field of Classification Search
None
See application file for complete search history.

(56) References Cited

U.S. PATENT DOCUMENTS

| | | | |
|---|---|---|---|
| 9,595,451 B1* | 3/2017 | Zhou | H01L 21/31116 |
| 10,283,370 B1* | 5/2019 | Ros Bengoechea | H01L 21/31116 |
| 2007/0059938 A1* | 3/2007 | Kida | H01J 37/32935 257/E21.252 |
| 2015/0079797 A1* | 3/2015 | Chen | H01L 21/3065 438/711 |
| 2018/0286707 A1* | 10/2018 | Hudson | H01J 37/3244 |

* cited by examiner

*Primary Examiner* — Stephanie P Duclair

(57) ABSTRACT

A method of high-throughput dry etching of a film by proton-mediated catalyst formation. The method includes providing a substrate having a film thereon containing silicon-oxygen components, silicon-nitrogen components, or both, introducing an etching gas in the process chamber, plasma-exciting the etching gas, and exposing the film to the plasma-excited etching gas to etch the film. In one example, the etching gas contains at least three different gases that include a fluorine-containing gas, a hydrogen-containing gas, and a nitrogen-containing gas, plasma-exciting the etching gas. In another example, the etching gas contains at least four different gases that include a fluorine-containing gas, a hydrogen-containing gas, an oxygen-containing gas, and a silicon-containing gas.

17 Claims, 5 Drawing Sheets

HIGH-THROUGHPUT DRY ETCHING OF FILMS CONTAINING SILICON-OXYGEN COMPONENTS OR SILICON-NITROGEN COMPONENTS BY PROTON-MEDIATED CATALYST FORMATION

This application is related to and claims priority to U.S. Provisional Patent Application Ser. No. 63/113,613 filed on Nov. 13, 2020, the entire contents of which are herein incorporated by reference.

FIELD OF INVENTION

The present invention relates to the field of semiconductor manufacturing and semiconductor devices, and more particularly, to a method of plasma etching films containing silicon-oxygen components, silicon-nitrogen components, or both, in semiconductor manufacturing.

BACKGROUND OF THE INVENTION

Manufacturing of advanced semiconductor devices requires high-throughput dry etching of many films having silicon-oxygen components, silicon-nitrogen components, or both.

SUMMARY OF THE INVENTION

A method of plasma etching a film having silicon-oxygen components, silicon-nitrogen components, or both, in semiconductor manufacturing is disclosed in several embodiments.

According to one embodiment, the method includes providing a substrate having a film thereon, the film having silicon-oxygen components, silicon-nitrogen components, or both, performing gas phase etching of the film by: introducing an etching gas containing: a) at least three different gases that include a fluorine-containing gas, a hydrogen-containing gas, and a nitrogen-containing gas, or b) at least four different gases that include a fluorine-containing gas, a hydrogen-containing gas, an oxygen-containing gas, and a silicon-containing gas, plasma-exciting the etching gas; and exposing the substrate to the plasma-excited etching gas.

According to one embodiment, the method includes providing a substrate having a film thereon, the film having silicon-oxygen components, silicon-nitrogen components, or both, introducing an etching gas containing at least three different gases that include a fluorine-containing gas, a hydrogen-containing gas, and a nitrogen-containing gas; plasma-exciting the etching gas, and exposing the substrate to the plasma-excited etching gas to etch the film.

According to one embodiment, the method includes providing a substrate having a film thereon, the film having silicon-oxygen components, silicon-nitrogen components, or both, introducing an etching gas containing at least four different gases that include a fluorine-containing gas, a hydrogen-containing gas, an oxygen-containing gas, and a silicon-containing gas, plasma-exciting the etching gas, and exposing the substrate to the plasma-excited etching gas to etch the film.

DETAILED DESCRIPTION OF THE DRAWINGS

Figure 1:
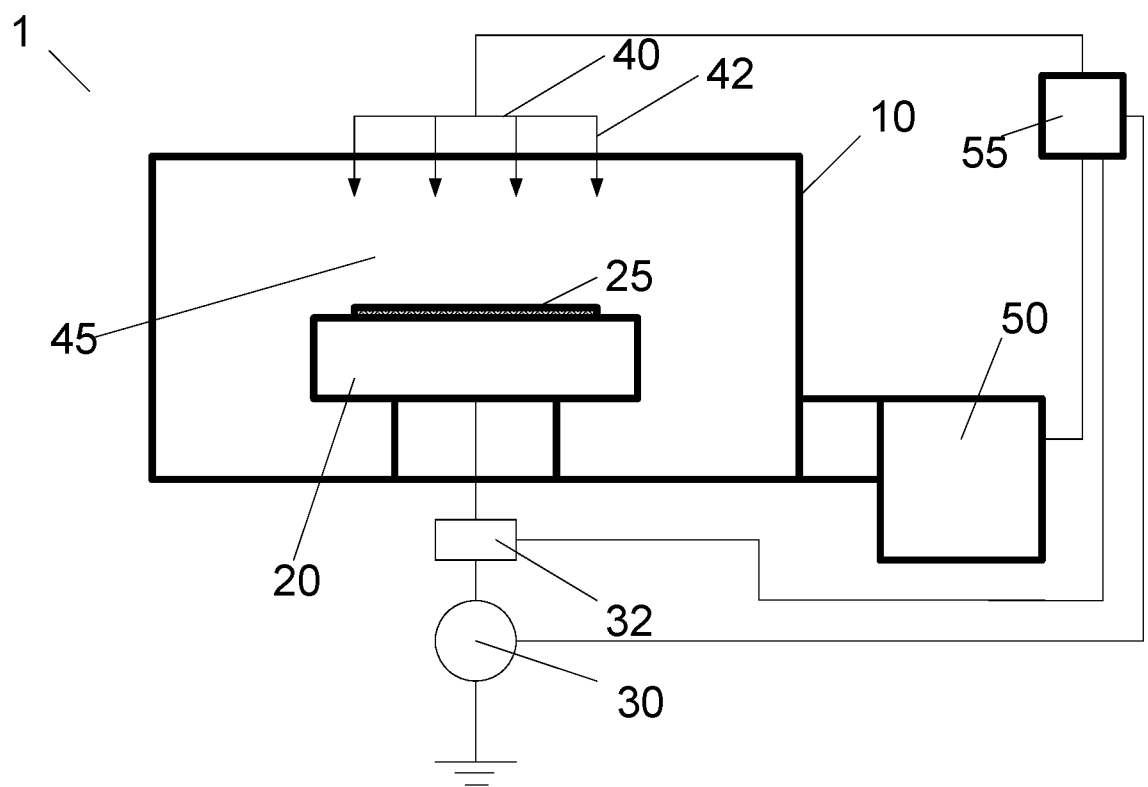
Figure 2:
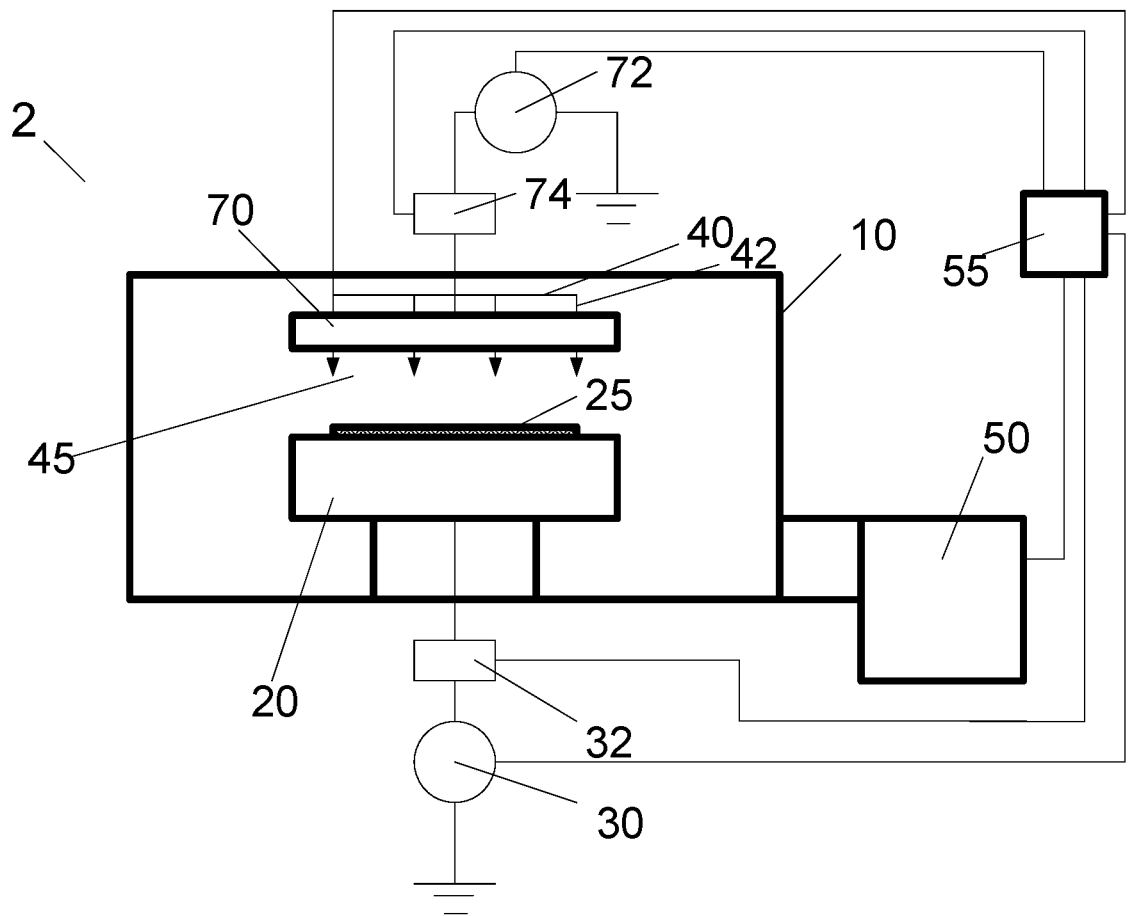
Figure 3A:
Figure 3B:
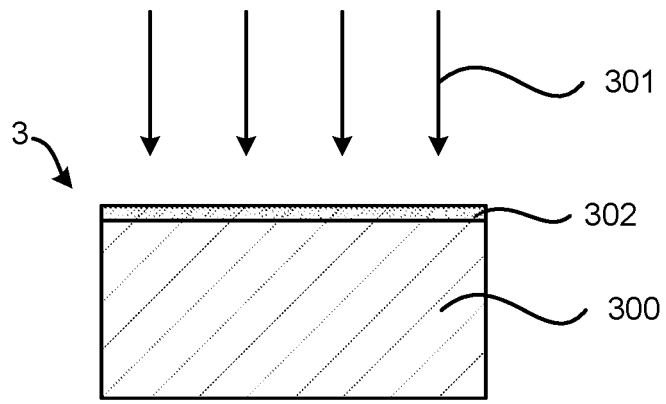
Figure 3C:
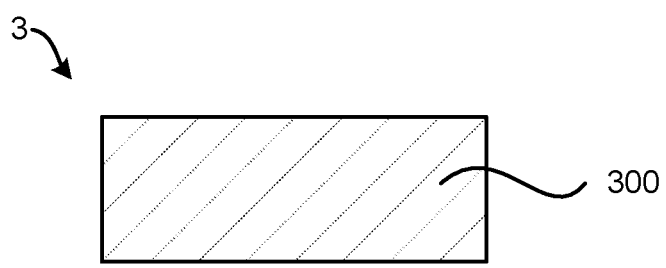
Figure 4A:
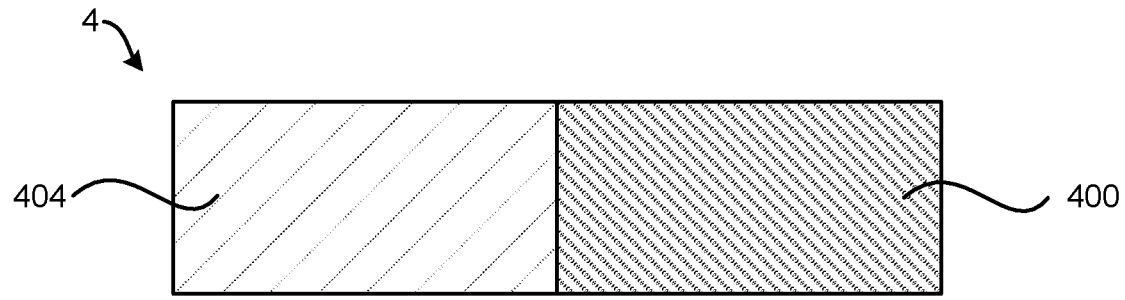
Figure 4B:
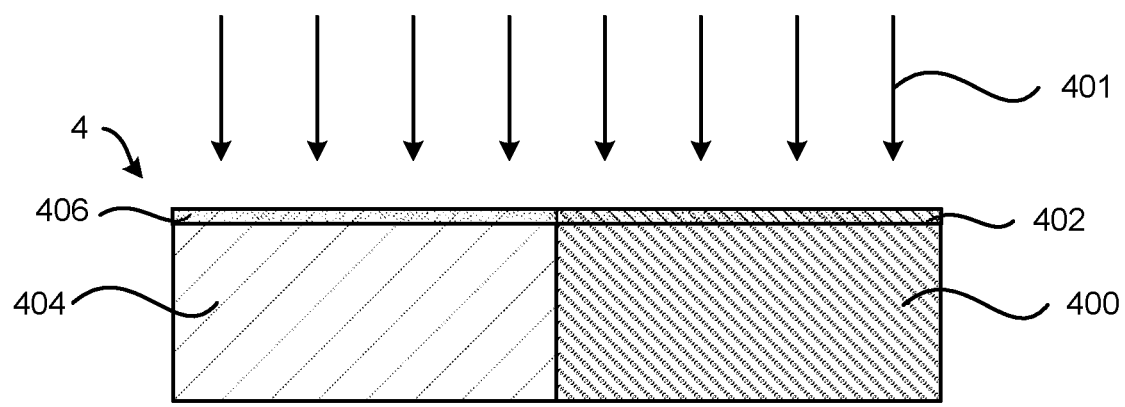
Figure 4C:
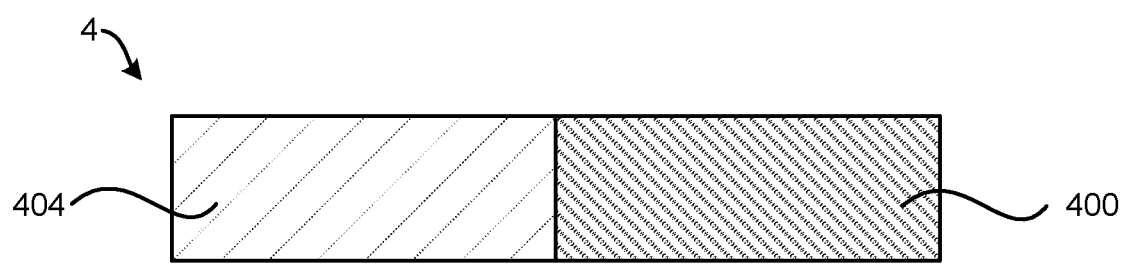
Figure 5A:
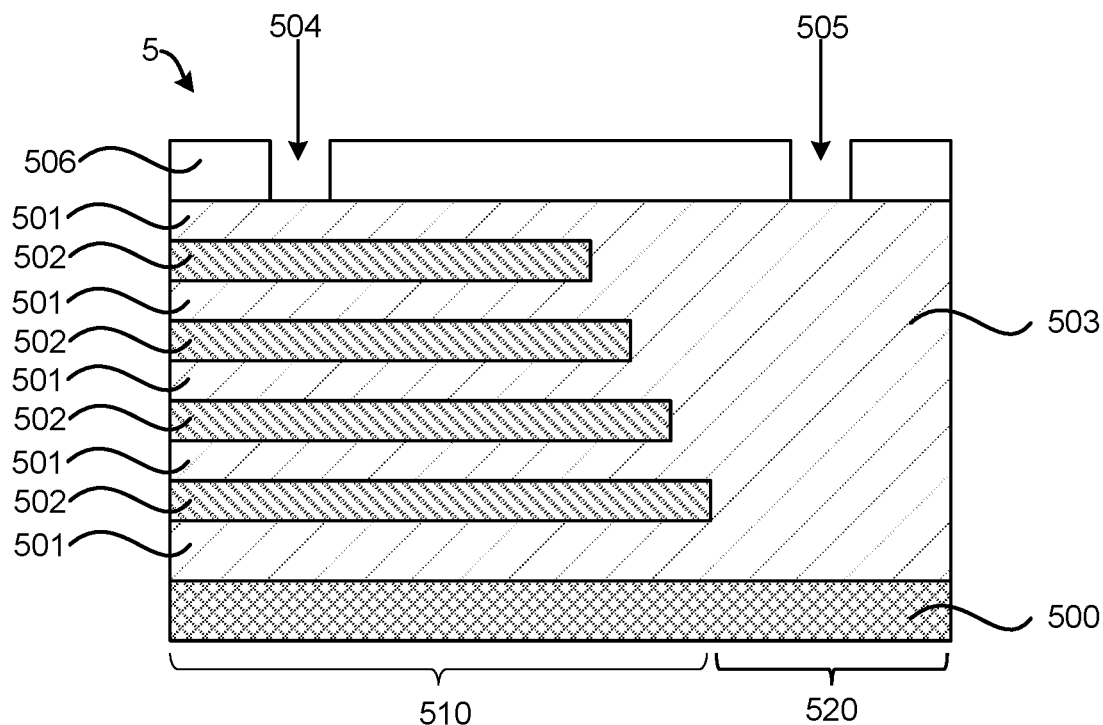
Figure 5B:
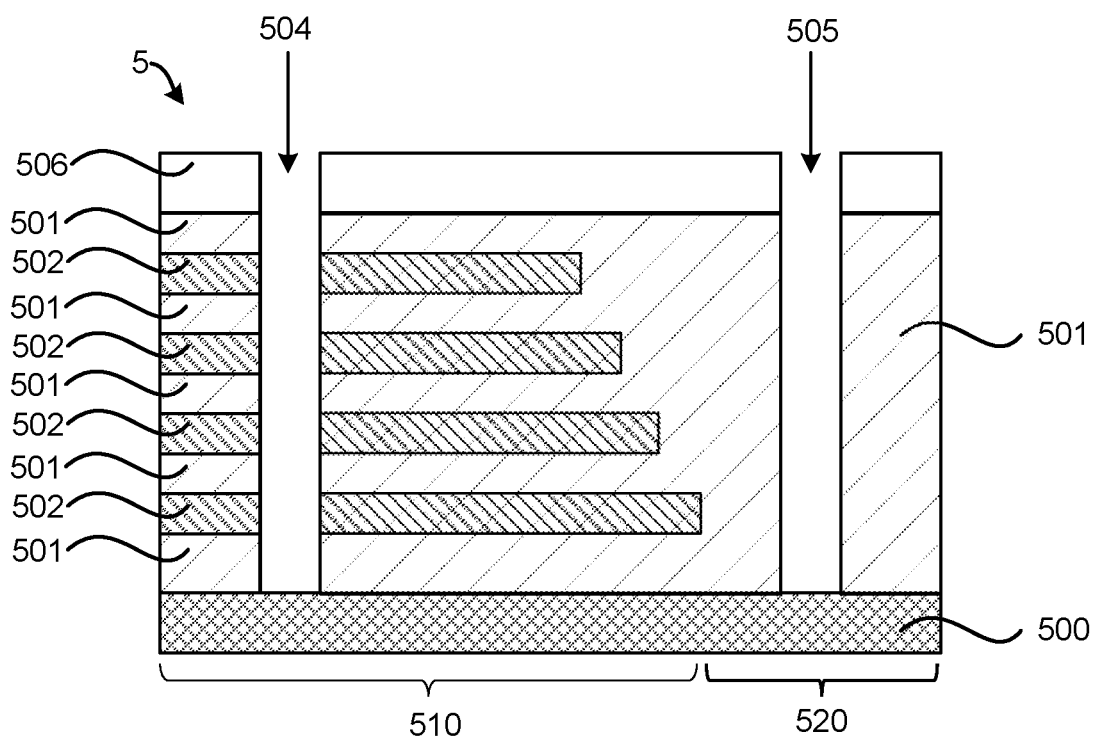

In the accompanying drawings:

FIG. 1 schematically shows a plasma processing system according to one embodiment of the invention;

FIG. 2 schematically shows a plasma processing system according to another embodiment of the invention;

FIGS. 3A-3C schematically show through cross-sectional views a method of dry etching a film by proton-mediated catalyst formation according to one embodiment of the invention;

FIGS. 4A-4C schematically show through cross-sectional views a method of dry etching a film by proton-mediated catalyst formation according to another embodiment of the invention; and FIGS. 5A and 5B schematically show through cross-sectional views a method of etching a 3D-NAND flash memory devices by proton-mediated catalyst formation according to an embodiment of the invention.

DETAILED DESCRIPTION OF SEVERAL EMBODIMENTS

A method of high-throughput dry etching of films having silicon-oxygen components, silicon-nitrogen components, or both. For example, the method may be used for etching high-aspect-ratio contact holes (HARC) in dynamic random access memory (DRAM) devices and etching 3D-NAND flash memory devices. The films containing silicon-oxygen components can have Si and O as the major constituents, and can, for example, include $SiO_2$, non-stoichiometric silicon oxides that can have a wide range of Si and O compositions (e.g., $SiO_x$, where x<2)), nitridated silicon oxides, and low-k materials. $SiO_2$ is the most thermodynamically stable of the silicon oxide materials and hence the most commercially important. Similarly, the films containing silicon-nitrogen components can have Si and N as the major constituents, and can, for example, include $Si_3N_4$, non-stoichiometric silicon nitrides that can have a wide range of Si and N compositions, oxidized silicon nitrides, and low-k materials. $Si_3N_4$ is the most thermodynamically stable of the silicon nitrides and hence the most commercially important of the silicon nitrides.

FIG. 1 schematically shows a plasma processing system according to one embodiment of the invention. The plasma processing system 1 depicted in FIG. 1 includes a process chamber 10, a substrate holder 20, upon which a substrate 25 to be processed is affixed, a gas injection system 40, and a vacuum pumping system 50. The process chamber 10 is configured to facilitate the generation of plasma in a processing region 45 adjacent a surface of the substrate 25, where plasma is formed via collisions between heated electrons and an ionizable gas. An ionizable gas or mixture of gases is introduced via the gas injection system 40 and the process pressure is adjusted. For example, a gate valve (not shown) may be used to throttle the evacuation of the process chamber 10 by the vacuum pumping system 50.

The substrate 25 is transferred into and out of chamber 10 through a slot valve (not shown) and chamber feed-through (not shown) via robotic substrate transfer system where it is received by substrate lift pins (not shown) housed within substrate holder 20 and mechanically translated by devices housed therein. Once the substrate 25 is received from the substrate transfer system, it is lowered to an upper surface of the substrate holder 20.

In an alternate embodiment, the substrate 25 is affixed to the substrate holder 20 via an electrostatic clamp (not shown). Furthermore, the substrate holder 20 further includes a cooling system including a re-circulating coolant flow that receives heat from the substrate holder 20 and transfers heat to a heat exchanger system (not shown), or when heating, transfers heat from the heat exchanger system. Moreover, gas may be delivered to the back-side of the substrate 25 to improve the gas-gap thermal conductance between the substrate 25 and the substrate holder 20. Such a system is utilized when temperature control of the substrate is required at elevated or reduced temperatures. For example, temperature control of the substrate 25 may be useful at temperatures in excess of the steady-state temperature achieved due to a balance of the heat flux delivered to the substrate 25 from the plasma and the heat flux removed from substrate 25 by conduction to the substrate holder 20. In other embodiments, heating elements, such as resistive heating elements, or thermo-electric heaters/coolers may be included. According to one embodiment, the substrate holder 20 may be configured for maintaining the substrate 1 at a substrate temperature between about −30° C. and about 200° C. Further, the substrate temperature may be between about −30° C. and about room temperature, between about room temperature and about 100° C., between about room temperature and about 200° C., or between about 100° C. and about 200° C.

In one embodiment, shown in FIG. 1, the substrate holder 20 further serves as an electrode through which radio frequency (RF) power is coupled to plasma in the processing region 45. For example, the substrate holder 20 is electrically biased at a RF voltage via the transmission of RF power from an RF generator 30 through an impedance match network 32 to the substrate holder 20. The RF bias serves to heat electrons and, thereby, form and maintain plasma in the processing region 45. In this configuration, the system operates as a reactive ion etch (RIE) reactor, where the chamber wall and the gas injection system 40 serve as ground surfaces. A frequency for the RF bias can, for example range from about 400 KHz to about 100 MHz, or from about 1 MHz to about 100 MHz, and can be 13.56 MHz.

In another embodiment, RF power is applied to the substrate holder electrode at multiple frequencies. In some examples, the frequency for the RF bias can be 400 KHz, or both 400 KHz and 40 MHz. Furthermore, the impedance match network 32 serves to maximize the transfer of RF power to plasma in process chamber 10 by minimizing the reflected power. Match network topologies (e.g., L-type, π-type, T-type, etc.) and automatic control methods are known in the art.

With continuing reference to FIG. 1, a process gas 42 (e.g., etching gas) is introduced to the processing region 45 through the gas injection system 40. The gas injection system 40 can include a showerhead, wherein the process gas 42 is supplied from a gas delivery system (not shown) to the processing region 45 through a gas injection plenum (not shown), a series of baffle plates (not shown) and a multi-orifice showerhead gas injection plate (not shown). Vacuum pump system 50 preferably includes a turbo-molecular vacuum pump (TMP) capable of a pumping speed up to 5000 liters per second (and greater) and a gate valve (not shown) for throttling the gas exhaust and controlling the chamber gas pressure.

A computer 55 includes a microprocessor, a memory, and a digital I/O port capable of generating control voltages sufficient to communicate and activate inputs to the plasma processing system 1 as well as monitor outputs from the plasma processing system 1. Moreover, the computer 55 is coupled to and exchanges information with the RF generator 30, the impedance match network 32, the gas injection system 40 and the vacuum pump system 50. A program stored in the memory is utilized to activate the inputs to the aforementioned components of a plasma processing system 1 according to a stored process recipe.

In another embodiment, shown in FIG. 2, the plasma processing system 2 further includes an upper plate electrode 70 to which RF power is coupled from an RF generator 72 through an impedance match network 74. A typical frequency for the application of RF power to the upper electrode ranges from 10 MHz to 200 MHz and is preferably 60 MHz. Additionally, a typical frequency for the application of power to the lower electrode ranges from 0.1 MHz to 30 MHz and is preferably 2 MHz. Moreover, the computer 55 is coupled to the RF generator 72 and the impedance match network 74 in order to control the application of RF power to the upper electrode 70.

In other embodiments, the plasma etching may be performed in inductively coupled plasma (ICP) systems, remote plasma systems that generate plasma-excited species upstream from the substrate, or electron cyclotron resonance (ECR) systems.

FIGS. 3A-3C schematically show through cross-sectional views a method of dry etching a film by proton-mediated catalyst formation according to an embodiment of the invention. FIG. 3A schematically shows a substrate 3 containing a film 300 to be etched by a dry etching process in a process chamber. According to embodiments of the invention, the film 300 contains silicon-oxygen components, silicon-nitrogen components, or both. A film 300 having silicon-oxygen components can includes $SiO_2$, a non-stoichiometric silicon oxide, a nitridated silicon oxide, or a low-k material. A film 300 having silicon-nitrogen components can include $Si_3N_4$, a non-stoichiometric silicon nitride, an oxidized silicon nitride, or a low-k material.

In FIG. 3B, the substrate 3 is exposed to a plasma-excited etching gas 301 that forms a catalytic layer 302 during etching of the film 300. In one embodiment, the catalytic layer 302 is formed from plasma-assisted deposition of reactive species from the plasma-excited etching gas 301.

According to one embodiment, the etching gas contains at least three different gases, where the three different gases include a fluorine-containing gas, a hydrogen-containing gas, and a nitrogen-containing gas. Additionally, the etching gas can further include He, Ar, Ne, Kr, Xe, or $N_2$. The fluorine-containing gas may, for example, be selected from the group consisting of $NF_3$, $XeF_2$, $SF_6$, $CF_4$, $CH_3F$, $CH_2F_2$, $CHF_3$, $C_2F_6$, $C_4F_8$, $C_3F_8$, $C_4F_6$, $ClF_3$, $F_2$, and combinations thereof. The hydrogen-containing gas may be selected from the group consisting of $H_2$, HF, HCl, HBr, HI, $SiH_4$, $CH_3F$, $CH_2F_2$, $CHF_3$, $CH_4$, $CH_2O$, $NH_3$, $N_2H_4$, $N_2H_2$, $H_2S$, $H_2O$, and combinations thereof. The nitrogen-containing gas may be selected from the group consisting of $NH_3$, $N_2H_4$, $N_2H_2$, $N_2$, $NO_2$, $NF_3$, $NCl_3$, NO, and combination thereof. In one example, the catalytic layer 302 can contain $[NH_4]^+/NH_3$ and HF surface species that are generated from an etching gas 301 containing $CF_4/NF_3/H_2$ gases.

According to another embodiment, the etching gas contains at least four different gases, where the four different gases include a fluorine-containing gas, a hydrogen-containing gas, an oxygen-containing gas, and a silicon-containing gas. The fluorine-containing gas may be selected from the group consisting of $NF_3$, $XeF_2$, $SF_6$, $CF_4$, $CH_3F$, $CH_2F_2$, $CHF_3$, $C_2F_6$, $C_4F_8$, $C_3F_8$, $C_4F_6$, $ClF_3$, $F_2$, and combinations thereof. The hydrogen-containing gas may be selected from the group consisting of $H_2$, HF, HCl, HBr, HI, $SiH_4$, $CH_3F$, $CH_2F_2$, $CHF_3$, $CH_4$, $CH_2O$, $NH_3$, $N_2H_4$, $N_2H_2$, $H_2S$, $H_2O$, and combinations thereof. The oxygen-containing gas may be selected from the group consisting of $O_2$, $CO_2$, CO, $CH_2O$, $H_2O$, $NO_2$, NO, and combinations thereof. The silicon-containing gas may be selected from the group consisting of $SiF_4$, $SiH_4$, $SiH_2Cl_2$, $SiCl_4$, $SiH_2F_2$, $SiF_2Cl_2$, $Si_2H_6$, and combinations thereof.

In one example, the catalytic layer 302 can contain Si—OH and HF surface species that are generated from an etching gas 301 containing $CF_4/CH_4/O_2/SiCl_4$ gases. The catalytic layer 302 is expected to have a thickness of few atomic layers, or less, and the presence of the catalytic layer 302 accelerates the etching of the film 300 by serving as proton mediators for the HF surface species to react with the film 300 via a Bronsted acid-base mechanism, and also by increasing the surface coverage of HF reactants via increasing the surface adsorption energy. This results in a strong catalytic effect due to the high surface fluorine reactant density and provides high etch rate of the film 300. The dry etching of the film 300 forms volatile by-products that include $SiF_x(g)$ and $H_2O(g)$ for a film having silicon-oxygen components and $SiF_x(g)$ and $NH_3(g)$ for a film having silicon-nitrogen components. The volatile by-products are exhausted from the process chamber by a vacuum pumping system. FIG. 3C shows that substrate 3 following the etching process where the film 300 has been thinned.

FIGS. 4A-4C schematically show through cross-sectional views a method of dry etching a film by proton-mediated catalyst formation according to an embodiment of the invention. FIG. 4A schematically shows a substrate 4 containing a first film 400 and a second film 404 to be etched by a dry etching process in a process chamber. According to embodiments of the invention, the first film 400 contains a silicon-oxygen component (e.g., $SiO_2$) and the second film 404 contains a silicon-nitrogen component (e.g., $Si_3N_4$). In this example, an exposed upper surface of the film 400 and an exposed upper surface of the second film 402 are in the same horizontal plane, but this is not required and embodiments of the invention equally apply to surfaces that are not in the same horizontal planes.

In FIG. 4B, the substrate 4 is exposed to a plasma-excited etching gas 401 that forms a catalytic layer 402 on the first film 400 and a catalytic layer 406 on the second film 404 during the etching process. The catalytic layers 402 and 406 can have the same or similar chemical composition since the surface species are generated from the etching gas 401. FIG. 4C shows that substrate 4 following the etching process where the films 400 and 404 have been thinned.

According to one embodiment, the etching gas contains at least three different gases, where the three different gases include a fluorine-containing gas, a hydrogen-containing gas, and a nitrogen-containing gas. Further, the etching gas can further include He, Ar, Ne, Kr, Xe, or $N_2$. The fluorine-containing gas may be selected from the group consisting of $NF_3$, $XeF_2$, $SF_6$, $CF_4$, $CH_3F$, $CH_2F_2$, $CHF_3$, $C_2F_6$, $C_4F_8$, $C_3F_8$, $C_4F_6$, $ClF_3$, $F_2$, and combinations thereof. The hydrogen-containing gas may be selected from the group consisting of $H_2$, HF, HCl, HBr, HI, $SiH_4$, $CH_3F$, $CH_2F_2$, $CHF_3$, $CH_4$, $CH_2O$, $NH_3$, $N_2H_4$, $N_2H_2$, $H_2S$, $H_2O$, and combinations thereof. The nitrogen-containing gas may be selected from the group consisting of $NH_3$, $N_2H_4$, $N_2H_2$, $N_2$, $NO_2$, $NF_3$, $NCl_3$, NO, and combination thereof.

According to another embodiment, the etching gas contains at least four different gases, where the four different gases include a fluorine-containing gas, a hydrogen-containing gas, an oxygen-containing gas, and a silicon-containing gas. The fluorine-containing gas may be selected from the group consisting of $NF_3$, $XeF_2$, $SF_6$, $CF_4$, $CH_3F$, $CH_2F_2$, $CHF_3$, $C_2F_6$, $C_4F_8$, $C_3F_8$, $C_4F_6$, $ClF_3$, $F_2$, and combinations thereof. The hydrogen-containing gas may be selected from the group consisting of $H_2$, HF, HCl, HBr, HI, $SiH_4$, $CH_3F$, $CH_2F_2$, $CHF_3$, $CH_4$, $CH_2O$, $NH_3$, $N_2H_4$, $N_2H_2$, $H_2S$, $H_2O$, and combinations thereof. The oxygen-containing gas may be selected from the group consisting of $O_2$, $CO_2$, CO, $CH_2O$, $H_2O$, $NO_2$, NO, and combinations thereof. The silicon-containing gas may be selected from the group consisting of $SiF_4$, $SiH_4$, $SiH_2Cl_2$, $SiCl_4$, $SiH_2F_2$, $SiF_2Cl_2$, $Si_2H_6$, and combinations thereof.

FIGS. 5A and 5B schematically show through cross-sectional views a method of etching a 3D-NAND flash memory device by proton-mediated catalyst formation according to an embodiment of the invention. FIG. 5A shows a partially manufactured device 5 having a first region 510 containing alternating films 501 (e.g., $SiO_2$) and 502 (e.g., $Si_3N_4$), and a second region 520 containing a film 503 (e.g., $SiO_2$ or $Si_3N_4$). The device 5 further includes an etch stop layer 500 (e.g., Si) and a patterned mask 506 (e.g., an amorphous carbon layer (ACL)) having a first patterned feature 504 in the first region 510 and a second patterned feature 505 in the second region 520. FIG. 5B shows the partially manufactured device 5 following an anisotropic etch process according to an embodiment of the invention, where the first patterned feature 504 is extended through the alternating films 501 and 502 in the first region 510, and the second patterned feature 505 is extended through the film 503 in the second region 520. In this example, since $SiO_2$ and $Si_3N_4$ etch at the same rate, the etch process reaches the etch stop layer 500 at the same time in the first and second regions 510,520. This avoids problems encountered when using other etching methods that require changing the etching gas composition through gas pulsing when etching through the alternating films 501 and 502.

A plurality of embodiments for plasma etching a film having silicon-oxygen components, silicon-nitrogen components, or both, in semiconductor manufacturing have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate etching method, comprising:
providing a substrate having a film thereon, the film having silicon-oxygen components and silicon-nitrogen components, and wherein the film contains layers of the silicon-oxygen components and silicon-nitrogen components in the same horizontal plane;
introducing an etching gas containing:
a) at least three different gases that include a fluorine-containing gas, a hydrogen-containing gas, and a nitrogen-containing gas, or
b) at least four different gases that include a fluorine-containing gas, a hydrogen-containing gas, an oxygen-containing gas, and a silicon-containing gas;
plasma-exciting the etching gas, wherein the plasma-exciting the etching gas includes generating a plasma in a processing region adjacent a surface of the film; and exposing the substrate to the plasma-excited etching gas to non-selectively etch the silicon-oxygen components and the silicon-nitrogen components in the film.

2. The method of claim 1, wherein the substrate is maintained at a temperature between about −30° C. and about 200° C.

3. The method of claim 1, wherein the nitrogen-containing gas is selected from the group consisting of $NH_3$, $N_2H_4$, $N_2H_2$, $N_2$, and combination thereof.

4. The method of claim 1, wherein the film contains layers of the silicon-oxygen components and silicon-nitrogen components that are not in the same horizontal plane.

5. A substrate etching method, comprising:
providing a substrate having a film thereon, the film having silicon-oxygen components and silicon-nitrogen components, and wherein the film contains layers of the silicon-oxygen components and silicon-nitrogen components in the same horizontal plane;
introducing an etching gas containing at least three different gases that include a fluorine-containing gas, a hydrogen-containing gas, and a nitrogen-containing gas;
plasma-exciting the etching gas; and
exposing the substrate to the plasma-excited etching gas to non-selectively etch the silicon-oxygen components and the silicon-nitride components in the film.

6. The method of claim 5, wherein the substrate is maintained at a temperature between about −30° C. and about 200° C.

7. The method of claim 5, wherein the fluorine-containing gas is selected from the group consisting of $NF_3$, $XeF_2$, $SF_6$, $CF_4$, $CH_3F$, $CH_2F_2$, $CHF_3$, $C_2F_6$, $C_4F_8$, $C_3F_8$, $C_4F_6$, $ClF_3$, $F_2$, and combinations thereof.

8. The method of claim 5, wherein the hydrogen-containing gas is selected from the group consisting of $H_2$, HF, HCl, HBr, HI, $SiH_4$, $CH_3F$, $CH_2F_2$, $CHF_3$, $CH_4$, $CH_2O$, $NH_3$, $N_2H_4$, $N_2H_2$, $H_2S$, $H_2O$, and combinations thereof.

9. The method of claim 5, wherein the nitrogen-containing gas is selected from the group consisting of $NH_3$, $N_2H_4$, $N_2H_2$, $N_2$, and combination thereof.

10. The method of claim 5, wherein the plasma-exciting the etching gas includes generating a plasma in a processing region adjacent a surface of the film.

11. A substrate etching method, comprising:
providing a substrate having a film thereon, the film having silicon-oxygen components and silicon-nitrogen components, and wherein the film contains layers of the silicon-oxygen components and silicon-nitrogen components in the same horizontal plane;
introducing an etching gas containing at least four different gases that include a fluorine-containing gas, a hydrogen-containing gas, an oxygen-containing gas, and a silicon-containing gas;
plasma-exciting the etching gas; and
exposing the substrate to the plasma-excited etching gas to non-selectively etch the silicon-oxygen components and the silicon-nitride components in the film.

12. The method of claim 11, wherein the substrate is maintained at a temperature between about −30° C. and about 200° C.

13. The method of claim 11, wherein the fluorine-containing gas is selected from the group consisting of $NF_3$, $XeF_2$, $SF_6$, $CF_4$, $CH_3F$, $CH_2F_2$, $CHF_3$, $C_2F_6$, $C_4F_8$, $C_3F_8$, $C_4F_6$, $ClF_3$, $F_2$, and combinations thereof.

14. The method of claim 11, wherein the hydrogen-containing gas is selected from the group consisting of $H_2$, HF, HCl, HBr, HI, $CH_4$, $H_2S$, $H_2O$, and combinations thereof.

15. The method of claim 11, wherein the oxygen-containing gas is selected from the group consisting of $O_2$, $CO_2$, CO, $CH_2O$, $H_2O$, and combinations thereof.

16. The method of claim 11, wherein the silicon-containing gas is selected from the group consisting of $SiH_2Cl_2$, $SiH_2F_2$, $SiF_2Cl_2$, $Si_2H_6$, and combinations thereof.

17. The method of claim 11, wherein the plasma-exciting the etching gas includes generating a plasma in a processing region adjacent a surface of the film.

* * * * *